United States Patent
Kim et al.

(10) Patent No.: US 8,551,288 B2
(45) Date of Patent: Oct. 8, 2013

(54) APPARATUS AND METHOD FOR REMOVING A PHOTORESIST STRUCTURE FROM A SUBSTRATE

(75) Inventors: In-Gi Kim, Yongin-si (KR); In-Seak Hwang, Suwon-si (KR); Dae-Hyuk Chung, Seongnam-si (KR); Kyoung-Hwan Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 673 days.

(21) Appl. No.: 12/213,859

(22) Filed: Jun. 25, 2008

(65) Prior Publication Data

US 2008/0264566 A1 Oct. 30, 2008

Related U.S. Application Data

(62) Division of application No. 11/488,706, filed on Jul. 19, 2006, now Pat. No. 7,405,164.

(30) Foreign Application Priority Data

Jul. 21, 2005 (KR) .................................. 2005-66374

(51) Int. Cl.
*H01L 21/312* (2006.01)
(52) U.S. Cl.
USPC ................. 156/345.34; 118/715; 156/345.33; 438/706; 438/725; 438/745
(58) Field of Classification Search
USPC ....... 118/715; 156/345.33, 345.34; 438/706, 438/725, 745
See application file for complete search history.

(56) References Cited

U.S. PATENT DOCUMENTS

| | | | | |
|---|---|---|---|---|
| 5,728,223 A | * | 3/1998 | Murakami et al. | 118/715 |
| 5,951,772 A | * | 9/1999 | Matsuse et al. | 118/723 R |
| 6,110,556 A | * | 8/2000 | Bang et al. | 428/64.1 |
| 6,132,512 A | * | 10/2000 | Horie et al. | 118/715 |
| 6,245,192 B1 | * | 6/2001 | Dhindsa et al. | 156/345.34 |
| 6,284,055 B1 | | 9/2001 | Dryer et al. | |
| 6,299,696 B2 | * | 10/2001 | Kamikawa et al. | 134/2 |
| 2002/0134409 A1 | | 9/2002 | Scovell | |
| 2003/0008528 A1 | | 1/2003 | Xia et al. | |
| 2004/0129224 A1 | * | 7/2004 | Yamazaki | 118/724 |
| 2005/0011447 A1 | * | 1/2005 | Fink | 118/715 |
| 2005/0022839 A1 | * | 2/2005 | Savas et al. | 134/1.2 |

FOREIGN PATENT DOCUMENTS

| | | | |
|---|---|---|---|
| JP | 06-224168 | * | 8/1994 |
| JP | 2002-134478 | | 5/2002 |
| KR | 1999-004453 | | 2/1999 |

* cited by examiner

*Primary Examiner* — Jeffrie R Lund
*Assistant Examiner* — Satish Chandra
(74) *Attorney, Agent, or Firm* — Harness, Dickey & Pierce, P.L.C.

(57) ABSTRACT

In an apparatus and method for removing a photoresist structure from a substrate, a chamber for receiving the substrate includes a showerhead for uniformly distributing a mixture of water vapor and ozone gas onto the substrate. The showerhead includes a first space having walls and configured to receive the water vapor, and a second space connected to the first space so that the water vapor is supplied to and partially condensed into liquid water on one or more walls of the first space. Ozone gas and water vapor without liquid water may be supplied to the second space to form the mixture therein. The showerhead may be heated to vaporize the liquid water on a given surface of the first space.

19 Claims, 5 Drawing Sheets

APPARATUS AND METHOD FOR REMOVING A PHOTORESIST STRUCTURE FROM A SUBSTRATE

DOMESTIC PRIORITY STATEMENT

This application claims priority under 35 U.S.C. §121 as a divisional of U.S. application Ser. No. 11/488,706, filed Jul. 19, 2006 now U.S. Pat. No. 7,405,164 with the United States Patent and Trademark Office (USPTO), the entire contents of which are incorporated herein by reference.

FOREIGN PRIORITY STATEMENT

This application claims priority under 35 U.S.C. §119 to Korean Patent Application No. 10-2005-0066374, filed on Jul. 21, 2005 with the Korean Intellectual Property Office (KIPO), the entire contents of which are incorporated herein by reference.

BACKGROUND

1. Technical Field

Example embodiments relate to an apparatus and a method for removing a photoresist structure.

2. Description of the Related Art

In general, semiconductor devices are manufactured by performing several processes. One process is a fabrication process for forming an electrical circuit on a silicon wafer that is used as a semiconductor substrate. An electrical die sorting (EDS) process is performed for inspecting electrical characteristics of the semiconductor devices formed by the fabrication process. A packaging process is then performed for packaging the semiconductor devices in epoxy resins and individuating the semiconductor devices.

In the fabrication process, a photoresist structure is formed on the substrate by a photolithography process. The photoresist structure is patterned by the photolithography process to form a photoresist structure on the substrate as a mask pattern for a subsequent process. For example, an etching process is performed on the substrate using the photoresist structure as an etching mask, so that an electric circuit is formed on the substrate. The photoresist structure is then removed from the substrate.

An ozone ashing process using ozone ($O_3$) gas and a light ashing process using a light are typically performed to remove the photoresist structure from the substrate. In the ozone ashing process, a heated gas including ozone ($O_3$) is supplied onto the photoresist structure, and a thermal decomposition process is generated in the photoresist structure by the gas including ozone ($O_3$). This removes the photoresist structure from the substrate. In the light ashing process, ultraviolet rays simultaneously break chemical bonds in the photoresist structure and change ozone ($O_3$) gas into activated oxygen ($O_2$) gas. The activated oxygen reacts with the photoresist structure having its chemical bonds broken by the ultraviolet rays, so that oxidation decomposition occurs in the photoresist structure to make the photoresist structure strongly volatile. Due to this strong volatility, the photoresist structure is removed from the substrate.

Generally, the chemical reaction between the ozone gas and the photoresist structure on the substrate tends to occur more actively at high temperatures. Thus, the higher the temperature in the substrate, the more active the chemical reaction of ozone and the photoresist structure. However, the higher the temperature of the substrate, there is also a problem in that there is an increased chance of generating defects in the formed semiconductor devices.

For the above reason, the photoresist pattern is removed from the substrate at a relatively low temperature. However, the low temperature in the substrate may markedly reduce the removal rate of the photoresist structure.

In the above conventional ozone ashing process and in an effort to alleviate problems due to the low temperature, water vapor is added to the ozone ($O_3$) gas so as to improve the removal rate of the photoresist structure in spite of a low temperature of the substrate.

A mixture of ozone ($O_3$) gas and water vapor is supplied to a first side of a substrate mounted on a susceptor and is exhausted from a second side of the substrate opposite to the first side. Because the mixture of ozone ($O_3$) gas and water vapor is added to the photoresist structure at a high thermal state, the mixture has a higher temperature when added to the photoresist structure, than when it is exhausted from it.

Accordingly, much more of the photoresist structure adjacent to the first side of the substrate is removed than that adjacent to the second side of the substrate. This is because the photoresist structure adjacent the first side of the substrate is at a higher temperature than the photoresist structure adjacent to the second side of the substrate. As a result, the photoresist structure is not removed uniformly from the substrate.

To overcome the above-mentioned problem, the mixture of water vapor and ozone ($O_3$) gas is added to a processing chamber and uniformly distributed onto the substrate including the photoresist structure. This is done through a showerhead installed at a top portion of the processing chamber. The mixture of water vapor and ozone ($O_3$) gas is uniformly distributed onto the substrate including the photoresist pattern through the showerhead, and the temperature in the photoresist pattern is substantially maintained at a constant. Hence, the photoresist pattern is more uniformly removed from the substrate.

However, using a mixture of water vapor and ozone ($O_3$) gas to bring about a uniform removal of the photoresist structure may cause other problems. Since the substrate including the photoresist structure is heated to a high temperature, the water vapor in the mixture is condensed and then is instantaneously vaporized. Consequently, the mixture makes contact with the heated substrate, which is known in the art as a spot phenomenon. Accordingly, a watermark, which is a trace of a water drop due to the spot phenomenon, remains on the substrate to cause defects in subsequent processes.

SUMMARY

An example embodiment is directed to an apparatus for removing a photoresist structure from a substrate. The apparatus may include a chamber receiving the substrate, a first gas source for supplying water vapor into the chamber, and a second gas source for supplying ozone gas into the chamber. The apparatus may include a showerhead for uniformly distributing a mixture of the water vapor and ozone gas onto the substrate. The showerhead may include an enclosed first space connected to the first gas source, and a second space connected to the second gas source and to the first space so that the water vapor is supplied to and partially condensed into liquid water on one or more surfaces of the first space. The ozone gas and water vapor without liquid water may be supplied to the second space from the second gas source and the first space to form the mixture therein. The apparatus may include a first heater heating the showerhead to vaporize the liquid water on a given surface of the first space.

Another example embodiment is directed to a method of removing a photoresist structure from a substrate. In the method, water vapor is supplied into an enclosed first space to be partially condensed into liquid water on surfaces of the first space, and the liquid water is vaporized in the first space. The water vapor without any liquid water may be supplied from the first space to a second space, and ozone gas may be supplied to the second space. A mixture of the water vapor and ozone gas may be uniformly supplied from the second space onto the substrate on which the photoresist structure is formed.

Another example embodiment is directed to an apparatus for removing a photoresist structure from a substrate. The apparatus may include a chamber receiving the substrate, and a showerhead for uniformly distributing a mixture of water vapor and ozone gas onto the substrate. The showerhead includes a first space having walls and configured to receive the water vapor, and a second space connected to the first space so that the water vapor is supplied to and partially condensed into liquid water on one or more walls of the first space. The ozone gas and water vapor without liquid water is supplied to the second space to form the mixture therein. The showerhead is heated to vaporize the liquid water on a given surface of the first space.

Another example embodiment is directed to a method of removing a photoresist structure from a substrate. In the method, water vapor is partially condensed into liquid water within a first space, and the liquid water is vaporized in the first space. The water vapor without liquid water is supplied to from the first space to a second space containing ozone gas. A mixture of the water vapor and ozone gas is uniformly supplied onto the substrate for removing the photoresist structure. Any spot phenomenon occurs within the first space and not on the substrate.

BRIEF DESCRIPTION OF THE DRAWINGS

Example embodiments may become more apparent upon review of the detailed description herein with reference to the attached drawings, wherein like elements are represented by like reference numerals. It should be understood that example embodiments are provided for purposes of illustration only and should not be construed to limit the scope of the present application.

DETAILED DESCRIPTION OF EXAMPLE EMBODIMENTS

Figure 1:
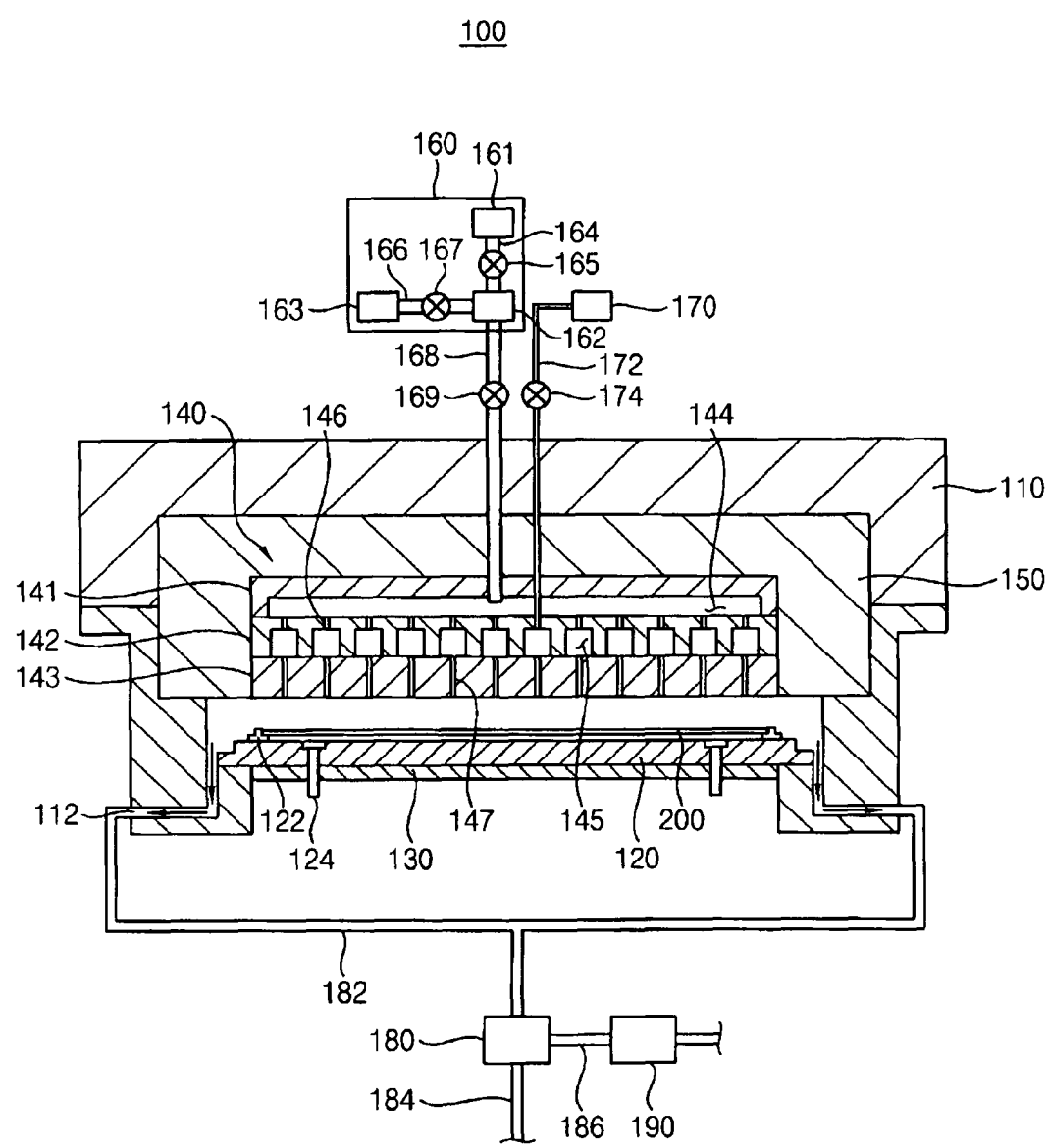
FIG. 1 is a structural view illustrating an apparatus for removing a photoresist structure according to example embodiments.

Example embodiments are described more fully hereinafter with reference to the accompanying drawings. Example embodiments may, however, be embodied in many different forms and should not be construed to limit the scope of the present application. In the drawings, the size and relative sizes of layers and regions may have been exaggerated for clarity.

When an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. These spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to limit the scope of the present application. As used herein, the singular forms "a," "an" and "the" are intended to include plural forms as well, unless the context clearly indicates otherwise. Terms such as "comprises" and/or "comprising", when used in this specification, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art, and will not be interpreted in an idealized or overly formal sense unless expressly so defined herein.

FIG. 1 is a structural view illustrating an apparatus for uniformly removing a photoresist structure from a substrate according to example embodiments. Referring to FIG. 1, the apparatus 100 (hereinafter referred to as a "photoresist removal apparatus") may include a chamber 110, a stage 120, a first heater 130, a showerhead 140, a second heater 150, a first gas source 160 and a second gas source 170.

The chamber 110 provides a processing space for removing a photoresist film or a photoresist pattern (hereafter "photoresist structure") from a substrate 200. Chamber 110 may have a cylindrical shape or a cubic shape, for example. An exhaustion hole 112 through which residual gases are exhausted from chamber 110 is formed at a bottom portion of the chamber 110. An entrance portion (not shown) through which the substrate 200 is induced into the chamber 110 is formed at a portion of a sidewall of the processing chamber 110.

Residual gases including a mixture of water vapor and ozone ($O_3$) gas pass through the exhaustion hole 112 and through a mist trap 180, and are exhausted from the processing chamber 110. The exhaustion hole 112 and mist trap 180 are connected to each other through a first exhausting line 182. The mist trap 180 separates the mixture into water vapor and ozone ($O_3$) gas. Water vapor is condensed into liquid water and the liquid water is exhausted from the photoresist removal apparatus 100 through a second exhausting line 184. Ozone ($O_3$) gas passes through a third exhausting line 186 and is changed into oxygen ($O_2$) gas in an ozone removal unit 190 positioned on a third exhausting line 186 so as to deteriorate toxicity of the ozone ($O_3$) gas. Accordingly, ozone ($O_3$) gas is exhausted from the photoresist removal apparatus 100 through the third exhausting line 186 (including the ozone removal unit 190) as oxygen ($O_2$) gas.

The stage 120 may be positioned at a lower portion of the chamber 110 and supports the substrate 200. The substrate 200 may be horizontally positioned on the stage 120. The stage 120 may have a disk shape to support the substrate 200. In the one example, the stage 120 is composed of a silicon carbide (SiC).

A plurality of guiding pins 122 may be positioned along a peripheral portion of an upper surface of the stage 120. In one example, the guiding pins 122 may generally have a pin shape. The substrate 200 is guided to an accurate position on the stage 120 by the guiding pins 122 as the substrate 200 is loaded onto the stage 120.

A plurality of lifting pins 124 may be positioned in penetration holes (not shown) penetrating the stage 120 around the guiding pins 122. The lifting pins 124 may move vertically along a corresponding penetration hole. Accordingly, the substrate 200 is loaded onto the stage 120 as the lifting pins 124 move downward. The substrate 200 is unloaded from the stage 120 as the lifting pins 124 move upward.

The first heater 130 is positioned under the stage 120 and heats the substrate 200 and photoresist structure. For example, heat is transferred to the stage 120 on which the substrate 200 is positioned by the first heater 130 and then transferred to the photoresist structure on the substrate 200 from the stage 120 due to thermal conduction. In one example, the photoresist structure may be heated to a temperature of about 98° C. to 100° C. In the present example embodiment, the substrate 200 may be heated to a temperature higher than the temperature at which the photoresist structure is heated, so as to compensate for heat loss from the substrate 200.

While the present example embodiment describes that the first heater 130 is positioned under the stage 120, the first heater 130 may be positioned inside the stage 120 together therewith, as would be evident to one of ordinary skill in the art.

The showerhead 140 is positioned on an upper portion of the chamber 110 and faces the stage 120 in the chamber 110. Ozone ($O_3$) gas and water vapor used to remove the photoresist structure from the substrate 200 are mixed in the showerhead 140 to form a mixture of water vapor and ozone ($O_3$) gas. The mixture is uniformly distributed onto the substrate 200 on the stage 120 via showerhead 140. In one example, the showerhead 140 may include first, second and third plates 141, 142 and 143, as shown in FIGS. 2 to 4.

Figure 2:
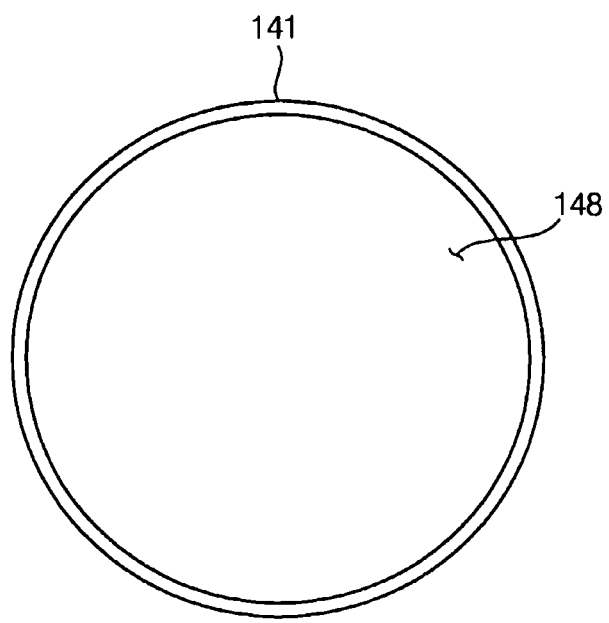
FIG. 2 is a plane view illustrating a bottom surface of a first plate of a showerhead in FIG. 1.
Figure 3:
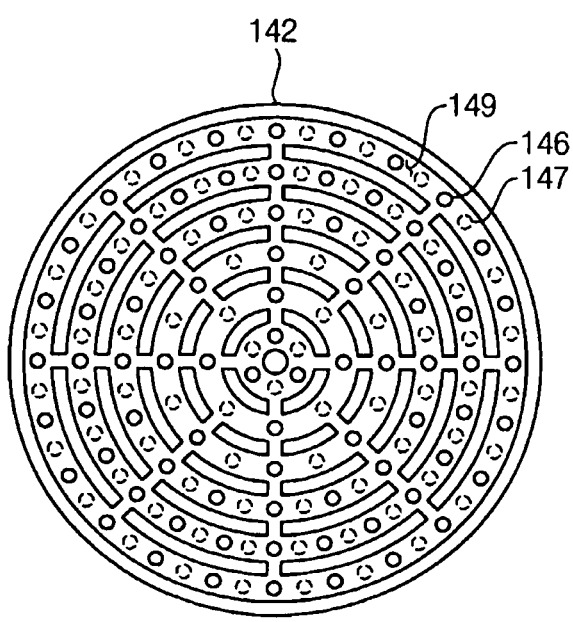
FIG. 3 is a plane view illustrating a bottom surface of a second plate of a showerhead in FIG. 1.
Figure 4:
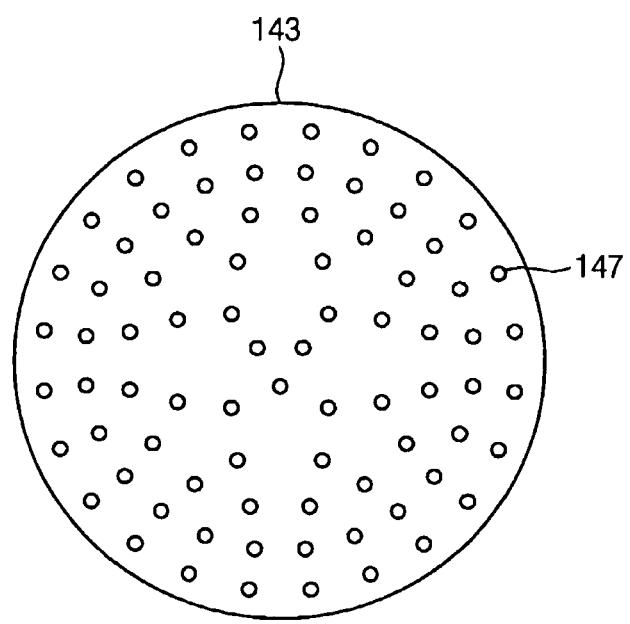
FIG. 4 is a plane view illustrating a bottom surface of a third plate of a showerhead in FIG. 1.

FIG. 2 is a plan view illustrating a bottom surface of the first plate 141, and FIG. 3 is a plan view illustrating a bottom surface of the second plate 142. FIG. 4 is a plan view illustrating a bottom surface of the third plate 143. Referring to FIGS. 1 to 4, a top view of the showerhead 140 illustrates a circle, so that the first, second and third plates 141, 142 and 143 may be formed into a circular shape. In FIG. 2, the first plate 141 has a circular shape and a bottom surface of the first plate 141 is recessed except for a peripheral portion thereof. The first plate 141 thus includes a recessed portion 148 on the bottom surface. When the first plate 141 is engaged with the second plate 142, the recessed portion 148 is closed by a top surface of the second plate 142 so that a first space 144 is formed between the first and second plates 141 and 142.

Referring FIG. 3, the second plate 142 has a circular shape with a diameter substantially identical to that of the first plate 141. A bottom surface of the second plate 142 is partially recessed. That is, the second plate 142 has a plurality of grooves 149 at the bottom surface thereof. The grooves 149 are formed along a circumferential direction with a consistent gap distance in a radial direction and in communication with one another. A plurality of first holes 146 are uniformly arranged on a top surface of the second plate 142 with a given gap distance in the radial direction and in communication with the grooves 149. As the second plate 142 is engaged with the third plate 143, the grooves 149 are closed by a top surface of the third plate 143 so that a second space 145 is formed between the second and third plates 142 and 143.

Water vapor supplied into the first space 144 may be partially condensed into liquid water on the surfaces of walls defining the first space 144. This is due to a temperature difference between water vapor and the showerhead 140. For example, water vapor supplied into the first space 144 is condensed on the bottom surface of the first plate 141 and the top surface of the second plate 142 due to the temperature difference. However, the showerhead 140 may be heated in advance by a second heater 150 so that vaporization of the liquid water is generated again, at the moment the liquid water contacts the surfaces of the walls surrounding first space 144. That is, the vaporization of the liquid water, described previously as a spot phenomenon, occurs in the showerhead 140. Because undesirable watermarks due to the spot phenomenon remain in the showerhead 140, the watermarks have no effect on the removal process for the photoresist structure from the substrate 200.

Referring to FIG. 4, the third plate 143 may have a circular shape with a diameter substantially identical to that of the first plate 141, and includes a plurality of second holes 147 through which the third plate 143 penetrates. The second holes 147 may be uniformly arranged on the third plate 143 with a given gap distance in a radial direction. When the second and third plates 142 and 143 are engaged, the second holes 147 communicate with the second space 145 and are arranged so that the first and second holes 146 and 147 alternate with each other, as shown in FIG. 3. Accordingly, the first and second holes 146 and 147 are not directly connected with each other. Hence, water vapor supplied through the first hole 146 may be prevented from being immediately exhausted through the second hole 147.

Ozone ($O_3$) gas is supplied into the second space 145, and water vapor in the first space 144 is provided to the second space 145 through the first holes 146. Therefore, water vapor is mixed with ozone ($O_3$) gas in the second space 145. The mixture of water vapor and ozone ($O_3$) gas is uniformly supplied onto the substrate 200 via the second holes 147.

The mixture is heated at a consistent temperature by the second heater 150 in the showerhead 140 and uniformly supplied from the showerhead 140 over the substrate 200. As the mixture contacts the substrate 200, a uniform temperature distribution of temperature of the mixture is maintained. The photoresist structure may thus be uniformly removed from the substrate 200, thereby improving removal uniformity of the photoresist structure.

The second heater 150 surrounds a side surface and a top surface of the showerhead 140. The second heater 150 heats the ozone ($O_3$) gas and water vapor mixture supplied to the shower head 140 to a given temperature. For example, the second heater 150 heats the showerhead 140, and the heated showerhead 140 heats the ozone ($O_3$) gas and water vapor mixture. The mixture is heated to a temperature in a range of about 98° C. to 105° C. In one example, the mixture may be heated to a temperature of about 103.5° C. In consideration of thermal budget, the mixture may be heated to a temperature higher than the range of about 98° C. to 105° C. As a result, the showerhead 140 is heated by the second heater 150 so that as soon as the water vapor is condensed into liquid water on surfaces of the showerhead 140 in the first space 144, the liquid water is again vaporized into water vapor.

The first gas source 160 supplies water vapor into the chamber 110. In one example, the first gas source 160 may include a vaporizer for generating water vapor. The first gas source 160 may include a first reservoir 161 for storing de-ionized water, a vaporizer 162 for vaporizing the de-ionized water to generate the water vapor, and a second reservoir 163 for storing a carrier gas which transfers the water vapor. The carrier gas may be an inactive gas such as nitrogen gas ($N_2$), helium gas (He), argon gas (Ar), etc.

The first reservoir 161 is connected to the vaporizer 162 through a first connecting line 164. A first valve 165 is installed in the first connecting line 164 to control flow of the de-ionized water. The second reservoir 163 is connected to the vaporizer 162 through a second connecting line 166, and a second valve 167 is installed to the second connecting line 166 to control flow of the carrier gas.

The first gas source 160 is connected to the chamber 110 through a first supplying line 168. The first supplying line 168 extends to an inside of the chamber 110 and communicates with the first space 144 of the showerhead 140. A third valve 169 is positioned on the first supplying line 168 to control a supplying flow of water vapor. While in the present example embodiment the first, second and third valves 165, 167 and 169 are used to control a supplying flow of a fluid, a mass flow controller may be used as an alternative to control a supplying flow of a fluid, as would be known to one of the ordinary skill in the art.

The de-ionized water is vaporized in the vaporizer 162 and transformed into water vapor. The water vapor is supplied to the first space 144 of the showerhead 140 through the first supplying line 168 by the carrier gas. While the present example embodiment shows the first gas source 160 as including the vaporizer 162 to vaporize the de-ionized water, the first gas source 160 may alternatively include a bubbler to vaporize the de-ionized water, as would be known to one of ordinary skill in the art.

The second gas source 170 supplies ozone ($O_3$) gas into the chamber 110. In one example embodiment, the second gas source 170 includes an ozone generator for generating the ozone ($O_3$) gas. In an example, oxygen and nitrogen gas are supplied to the ozone generator. The oxygen gas and nitrogen gas are mixed together in the ozone generator, and a high frequency electric power is applied to the mixture to thereby generate the ozone ($O_3$) gas. In one example, ozone ($O_3$) gas may be generated only when needed. When ozone ($O_3$) gas is not required, supply of the oxygen gas and nitrogen gas to the ozone generator may be discontinued.

The second gas source 170 is connected to the chamber 110 through a second supplying line 172. The second supplying line 172 extends to an inside of the chamber 110 and connects with the second space 145 of the showerhead 140. A fourth valve 174 is positioned on the second supplying line 172 to control a supplying flow of ozone ($O_3$) gas. While the present example embodiment discloses that the fourth valve 174 is used to control a supply flow of ozone ($O_3$) gas, a mass flow controller may be used to control a supply flow of ozone ($O_3$) gas, as would be known to one of ordinary skill in the art.

When an amount ratio of water vapor with respect to ozone ($O_3$) gas is not fixed, the amount ratio may be excessively small or large. When an amount ratio of water vapor with respect to ozone ($O_3$) gas is excessively small, a removal rate of the photoresist structure tends to be negligible, which would reduce productivity. In contrast, when the amount ratio is excessively large, water vapor is substantially condensed in the first space 144. Accordingly, in an example embodiment water vapor and ozone ($O_3$) gas may be supplied in a fixed ratio.

Water vapor and ozone ($O_3$) gas is respectively supplied to the chamber 110 and mixed with each other in the showerhead 140 positioned inside of the chamber 110 for supply to the substrate 200. Since the mixture is uniformly supplied to the substrate 200, the photoresist structure is uniformly removed from the substrate 200.

Water vapor is supplied into the first space 144 at a temperature different from that of the showerhead 140, so that the spot phenomenon occurs within the showerhead 140. Accordingly, the spot phenomenon may be substantially prevented from occurring on a surface of the substrate.

Figure 5:
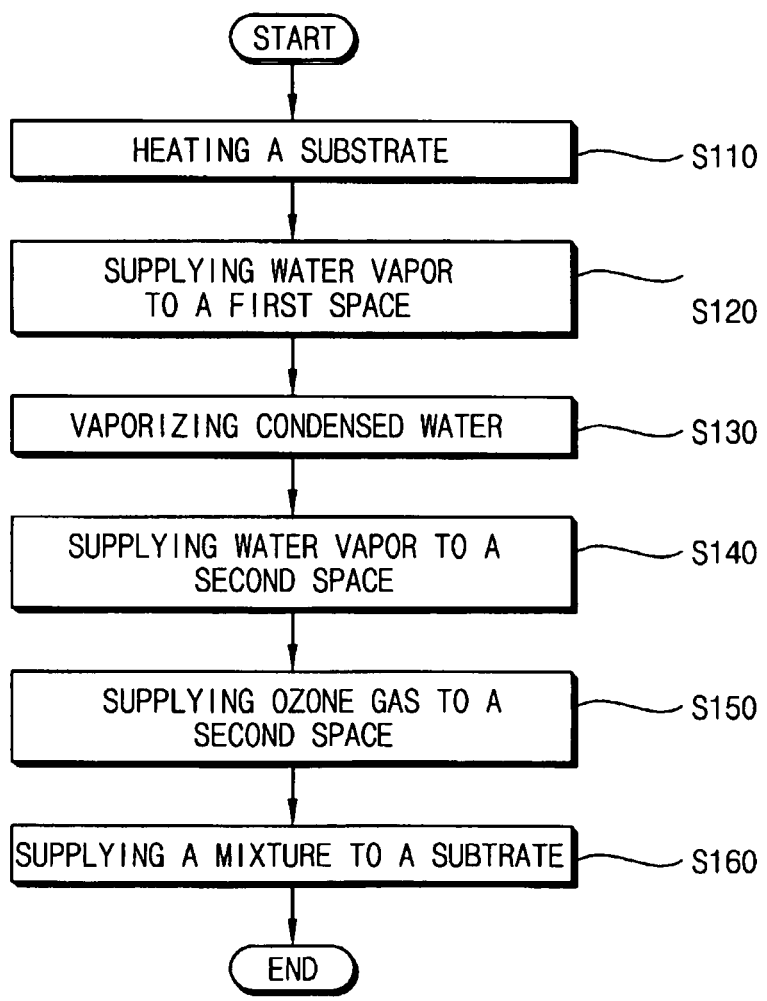
FIG. 5 is a flow chart illustrating a method of removing a photoresist structure according to example embodiments.

FIG. 5 is a flow chart illustrating a method of removing a photoresist structure according to example embodiments. Referring to FIG. 5, the substrate 200 on which a photoresist structure is formed is supplied to the chamber 110 using a transferring arm (not shown) and is supported on a lifting pin 124. Then, the lifting pin 124 is dropped down so that the substrate 200 is loaded onto a top surface of the stage 120. While loaded onto the stage 120, the guiding pin 122 guides the substrate 200.

The first heater 130 heats (S110) the substrate 200 loaded on the stage 120 to a temperature in a range of about 98° C. to 100° C. Thereafter, de-ionized water is supplied from the first reservoir 161 to the vaporizer 162 through the first connecting line 164 by opening the first valve 165. The de-ionized water vaporizes in the vaporizer 162. Inactive gas is supplied from the second reservoir 163 to the vaporizer 162 through the second connecting line 166 by opening the second valve 167. Inactive gas transfers water vapor. Water vapor generated at the first gas source 160 is supplied (S120) to the first space 144 blocked by the first plate 141 and the second plate 142 of the showerhead 140 through the first supplying line 168.

The temperature of the water vapor and the temperature inside the showerhead 140 are not always the same. The vapor is condensed on inner surfaces of the first space 144 due to the difference in temperature.

The showerhead 140 is heated to a temperature in a range of about 98° C. to about 105° C. by the second heater 150. In an example, the showerhead 140 is heated up to about 103.5° C. by the second heater 150. The condensed water is then vaporized (S130) by the heated showerhead 140.

A spot phenomenon where water vapor is condensed and vaporized occurs in the first space 144 of the showerhead 140. Then, water vapor is heated by the second heater 150 and supplied to the substrate 200. Therefore, the spot phenomenon does not occur on a surface of the substrate 200. Accordingly, a watermark, which results from the spot phenomenon and represents a defect, is not formed on the surface of the substrate 200.

Water vapor is continuously supplied from the first gas source 160 to the first space 144. The water vapor of the first space 144 is supplied (S140) to the second space 145 blocked by the second plate 142 and the third plate 143 through the plurality of first holes 146 of the second plate 142. Ozone ($O_3$) gas is generated in the ozone generator of the second gas source 170. Ozone ($O_3$) gas is supplied (S150) to the second space 145 through the second supplying line 172.

The water vapor and ozone ($O_3$) gas are uniformly mixed at the second space 145 to form a mixture. The mixture is uniformly supplied (S160) to the substrate 200 supported by the stage 120 through the plurality of second holes 147 of the third plate 143. As the mixture is heated by the second heater 150 in the shower head 140, the mixture is uniformly supplied from the showerhead 140 onto the substrate 200. Hence, the temperature of the mixture stays constant on all parts of substrate 200. Because the temperature of the mixture is uniform, the photoresist structure may be uniformly removed from the substrate 200, thereby improving removal uniformity of the photoresist structure.

The mixture gas for removing the photoresist structure is exhausted from the chamber 110 through the exhaustion hole 112. The ozone ($O_3$) gas and water vapor are separated from the mixture in a mist trap 180. Water vapor is changed into liquid water and the liquid water is exhausted through a drain. Because ozone ($O_3$) gas is toxic, it is dissolved into oxygen gas and exhausted from the chamber 100.

In the example method, the water vapor and ozone ($O_3$) gas are mixed with each other inside the showerhead 140 and uniformly supplied onto the substrate 200. Accordingly, the photoresist structure on the substrate 200 is uniformly removed so as to substantially improve removal uniformity.

Moreover in the example method, the spot phenomenon due to vaporization of water vapor in the chamber 110 occurs not on the surface of the substrate 200, but in the first space 144 of the showerhead 140. Accordingly, any watermark due to the spot phenomenon is prevented from being formed on a surface of the substrate 200, thereby reducing processing defects.

Figure 6:
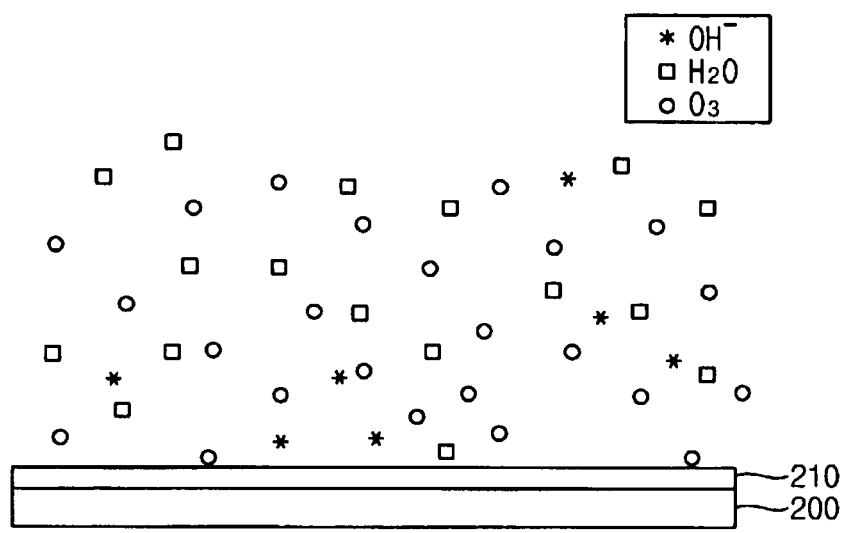
FIG. 6 illustrates a principle of removing photoresist structure using water vapor and ozone ($O_3$) gas.

FIG. 6 illustrates a principle of removing a photoresist structure using a water vapor and ozone ($O_3$) gas. Referring to FIG. 6, a plurality of hydroxyl ions (OH—) in a mixture of water vapor ($H_2O$) and ozone ($O_3$) gas separates hydrophobic groups of a monomer in the photoresist layer 210 on the substrate 200. For example, the hydroxyl ions (OH—) produced by a chemical reaction between water vapor and ozone ($O_3$) gas are reacted with carbons (C) in the monomer. As a result, the hydrophobic group (OR) is separated from the monomer.

Because of a combination of the hydroxyl ions (OH—) and a separation of the hydrophobic group, the monomer includes oxygen that has a negative electrical charge. That is, the monomer includes carboxyl ion (COO—) that has a negative electrical charge. The negatively charged oxygen offers a site of combination capable of combining a hydrogen ion or an alkali ion that has a positive electrical charge.

The hydrophobic group separated from the monomer due to the combination of the hydroxyl ion (OH—) includes an oxygen ion that has a negative electrical charge. The negatively charged oxygen ion is combined with the hydrogen ion remaining in the photoresist layer 210. Accordingly, a hydroxyl group is generated in the hydrophobic group so that the hydrophobic group may be changed into a hydrophilic group.

The separation of the hydrophobic group from the monomer is performed at a temperature between about 90° C. to 120° C. In one example, this may be performed at a temperature between about 98° C. to 100° C.

When the combination of the hydroxyl ion (OH—) and the separation of the hydrophobic group from the monomer are performed at a temperature below about 90° C., the separation rate of the hydrophobic group from the monomer of the photoresist layer 210 tends to be negligible. A temperature over about 120° C., a thermal stress is excessively applied to various patterns on the substrate 200. Thereafter, a cleaning solution is supplied onto the photoresist layer 210 including a monomer from which a hydrophobic group is separated, so that the photoresist layer 210 is changed to a water-soluble layer. In the present example embodiment, the cleaning solution is supplied onto the photoresist layer 210 at a temperature between about 90° C. to 120° C.

According to example embodiments, water vapor and ozone ($O_3$) gas are respectively supplied to the showerhead 140 positioned on an upper portion of the chamber 110, and mixed with each other in the showerhead 140. As a result, the mixture is uniformly supplied onto the substrate 200. Accordingly, the mixture has a constant temperature along an entire surface of the substrate 200 so that the photoresist layer 210 can be uniformly removed from the substrate. Moreover, a spot phenomenon due to the water vapor occurs not on a surface of the substrate 200, but in the showerhead 140. Accordingly, any watermark due to the spot phenomenon is prevented from being formed on the surface of the substrate 200.

Example embodiments being thus described, it will be obvious that the same may be varied in many ways. Such variations are not to be regarded as departure from the spirit and scope of example embodiments, and all such modifications as would be obvious to one skilled in the art are intended to be included within the scope of the following claims.

What is claimed is:

1. An apparatus for removing a photoresist structure from a substrate, comprising:
    a chamber for receiving the substrate on which the photoresist structure is formed;
    a first gas source for supplying water vapor into the chamber;
    a second gas source for supplying ozone gas into the chamber;
    a showerhead for uniformly distributing a mixture of the water vapor and ozone gas onto the substrate, the showerhead including an enclosed first space connected to the first gas source and a second space connected to the second gas source and to the first space so that the water vapor is supplied to and partially condensed into liquid water on one or more surfaces of the first space, with ozone gas and water vapor without liquid water being supplied to the second space from the second gas source and the first space to form the mixture therein; and
    a first heater heating the showerhead to vaporize the liquid water on the one or more surfaces of the first space,
    wherein the showerhead includes a first plate defining an upper bounds of the first space, a second plate having a plurality of first holes for enabling communication between the first space and second space, and a third plate having a plurality of second holes for enabling communication between the second space with an outside of the showerhead so that the mixture is supplied onto the substrate through the second holes, and upper and side regions of the first space and second space being bounded by the first heater, and wherein the first, second, and third plates including the first and second spaces are enclosed by the first heater and the first heater is disposed above the first plate within the chamber.

2. The apparatus of claim 1, wherein the first and second holes are alternately arranged with each other.

3. The apparatus of claim 1, wherein the showerhead is heated by the first heater to a temperature in a range of about 98° C. to 105° C.

4. The apparatus of claim 1, further comprising a second heater for heating the substrate.

5. The apparatus of claim 4, wherein the substrate is heated by the second heater to a temperature in a range of about 98° C. to 100° C.

6. The apparatus of claim 1, wherein water vapor is supplied into the chamber using an inactive gas as a carrier gas.

7. The apparatus of claim 1, wherein the first space is above the second space.

8. The apparatus of claim 1, wherein the first space is larger in volume than the second space.

9. The apparatus of claim 1, wherein the second space is directly connected to the second gas source such that the ozone gas supplied by the second gas source bypasses the first space.

10. The apparatus of claim 1, wherein the substrate is not in the first space or second space.

11. An apparatus for removing a photoresist structure from a substrate, comprising:

a chamber for receiving the substrate; and a showerhead for uniformly distributing a mixture of water vapor and ozone gas onto the substrate, the showerhead including a first space having walls and configured to receive the water vapor, and a second space connected to the first space so that the water vapor is supplied to and partially condensed into liquid water on one or more walls of the first space, with ozone gas and water vapor without liquid water being supplied to the second space to form the mixture therein, the showerhead being heated by a heater to vaporize the liquid water on the one or more walls of the first space, the showerhead including a stacked arrangement of a first plate, a second plate, and a third plate, the first and second plates defining a first space therebetween, the second and third plates defining a second space therebetween, and upper and side regions of the first space and second space being bounded by the heater, wherein the first, second, and third plates including the first and second spaces are enclosed by the heater and the heater is disposed above the first plate within the chamber.

12. The apparatus of claim 11, wherein:

the first plate defines an upper bounds of the first space;

the second plate has a plurality of first holes for enabling communication between the first space and second space, and the third plate has a plurality of second holes for enabling communication between the second space with an outside of the showerhead so that the mixture is supplied onto the substrate through the second holes, wherein the first and second holes are alternately arranged with each other.

13. The apparatus of claim 11, wherein the showerhead is heated to a temperature in a range of about 98° C. to 105° C.

14. The apparatus of claim 11, wherein the substrate is heated to a temperature in a range of about 98° C. to 100° C.

15. The apparatus of claim 11, wherein water vapor is supplied into the chamber using an inactive gas as a carrier gas.

16. The apparatus of claim 11, wherein the first space is above the second space.

17. The apparatus of claim 11, wherein the first space is larger in volume than the second space.

18. The apparatus of claim 11, wherein the showerhead is configured such that the ozone gas bypasses the first space en route to the second space.

19. The apparatus of claim 11, wherein the substrate is not in the first space or second space.

* * * * *